(12) United States Patent
Liu et al.

(10) Patent No.: US 11,824,077 B2
(45) Date of Patent: *Nov. 21, 2023

(54) CAPPING STRUCTURE TO REDUCE DARK CURRENT IN IMAGE SENSORS

(71) Applicant: Taiwan Semiconductor Manufacturing Co., Ltd., Hsin-Chu (TW)

(72) Inventors: Po-Chun Liu, Hsinchu (TW); Chung-Yi Yu, Hsin-Chu (TW); Eugene Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 310 days.

This patent is subject to a terminal disclaimer.

(21) Appl. No.: 16/952,384

(22) Filed: Nov. 19, 2020

(65) Prior Publication Data
US 2021/0074755 A1 Mar. 11, 2021

Related U.S. Application Data

(63) Continuation of application No. 16/047,455, filed on Jul. 27, 2018, now Pat. No. 10,861,896.

(51) Int. Cl.
*H01L 27/146* (2006.01)

(52) U.S. Cl.
CPC .. *H01L 27/14643* (2013.01); *H01L 27/14636* (2013.01); *H01L 27/14685* (2013.01)

(58) Field of Classification Search
CPC ........... H01L 27/1462; H01L 27/14643; H01L 27/14636; H01L 27/14685;
(Continued)

(56) References Cited

U.S. PATENT DOCUMENTS 5,796,118 A * 8/1998 Morikawa .............. B82Y 20/00
257/466
7,164,182 B2 1/2007 Mouli
(Continued)

OTHER PUBLICATIONS

Lange, et al. "Solid-State Time-of-Flight Range Camera" IEEE Journal of Quantum Electronics, vol. 37, No. 3, Mar. 2001.
(Continued)

*Primary Examiner* — Dale E Page
*Assistant Examiner* — Quovaunda Jefferson
(74) *Attorney, Agent, or Firm* — Eschweiler & Potashnik, LLC

(57) ABSTRACT

In some embodiments, a semiconductor device is provided. The semiconductor device includes an epitaxial structure having a group IV chemical element disposed in a semiconductor substrate, where the epitaxial structure extends into the semiconductor substrate from a first side of the semiconductor substrate. A photodetector is at least partially arranged in the epitaxial structure. A first capping structure having a first capping structure chemical element that is different than the first group IV chemical element covers the epitaxial structure on the first side of the semiconductor substrate. A second capping structure is arranged between the first capping structure and the epitaxial structure, where the second capping structure includes the group IV chemical element and the first capping structure chemical element.

20 Claims, 10 Drawing Sheets

(58) Field of Classification Search
CPC .......... H01L 27/14689; H01L 27/1469; H01L 27/1464; H01L 27/14601; H01L 27/14632; H01L 27/14634; H01L 27/14687; H01L 21/0229
See application file for complete search history.

(56) References Cited

U.S. PATENT DOCUMENTS

| | | |
|---|---|---|
| 8,304,816 B2 | 11/2012 | Kim et al. |
| 9,659,989 B1 | 5/2017 | Ai et al. |
| 10,861,896 B2 * | 12/2020 | Liu .................. H01L 27/14689 |
| 2004/0121507 A1 | 6/2004 | Bude et al. |
| 2005/0006565 A1 | 1/2005 | Mouli |
| 2005/0145848 A1 | 7/2005 | Mouli |
| 2013/0320419 A1 | 12/2013 | JangJian et al. |
| 2015/0255501 A1 | 9/2015 | Murano |
| 2016/0013241 A1 | 1/2016 | Yamaguchi |
| 2017/0025466 A1 | 1/2017 | Na et al. |
| 2019/0019830 A1 | 1/2019 | Minari et al. |

OTHER PUBLICATIONS

Non-Final Office Action dated Sep. 6, 2019 for U.S. Appl. No. 16/047,455.
Non-Final Office Action dated Feb. 4, 2020 for U.S. Appl. No. 16/047,455.
Notice of Allowance dated Jul. 29, 2020 for U.S. Appl. No. 16/047,455.

* cited by examiner

CAPPING STRUCTURE TO REDUCE DARK CURRENT IN IMAGE SENSORS

REFERENCE TO RELATED APPLICATION

This Application is a Continuation of U.S. application Ser. No. 16/047,455, filed on Jul. 27, 2018, the contents of which are hereby incorporated by reference in their entirety.

BACKGROUND

Many modern day electronic devices (e.g., digital cameras, optical imaging devices, etc.) comprise image sensors. Some types of image sensors include charge-coupled device (CCD) image sensors and complementary metal-oxide-semiconductor (CMOS) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
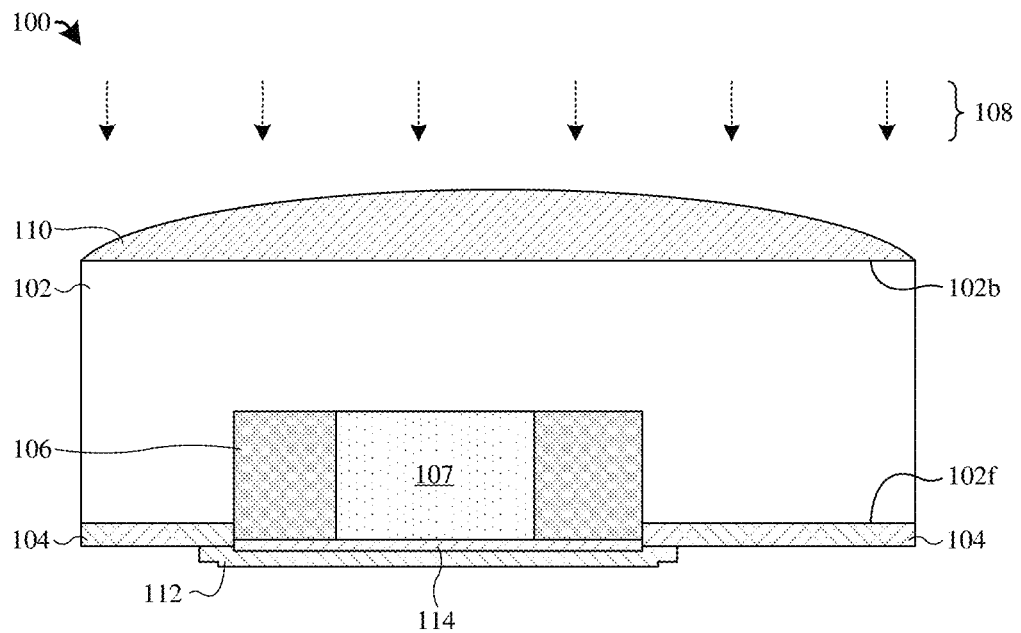
FIG. 1 illustrates a cross-sectional view of some embodiments of a complementary metal-oxide-semiconductor (CMOS) image sensor having a second capping structure disposed between a first capping structure and an epitaxial structure.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide-semiconductor (CMOS) image sensors comprise a semiconductor substrate having a plurality of germanium epitaxial structures disposed in the semiconductor substrate. Silicon capping structures are respectively disposed on the germanium epitaxial structures. Photodetectors each having a doped region are respectively disposed in the germanium epitaxial structures. The photodetectors are configured to absorb incident radiation and to generate respective electrical signals corresponding to the incident radiation. The doped regions respectively extend through the silicon capping structures and into the germanium epitaxial structures. The silicon capping structures passivate the germanium epitaxial structures and provide silicon atoms for formation of silicide structures on the doped regions.

One challenge with the CMOS image sensors is dark current. Dark current is electrical current that passes through the photodetectors even when no photons are entering the photodetector. The main dark current source in the photodetectors occurs at an interface between the germanium epitaxial structure and the silicon capping structure due to band discontinuity (e.g., a difference between the minimum conduction band energy and/or the maximum valence band energy of silicon and germanium) causing charge carriers (e.g., holes) to accumulate at the interface. Dark current degrades the performance of the CMOS image sensor by causing the photodetectors to generate electrical signals that may not correspond to the actual amount of incident radiation that the photodetectors respectively absorbed.

For example, one of the photodetectors may absorb a first amount of incident radiation that would typically correlate with the photodetector generating a first output signal corresponding to the actual amount of incident radiation absorbed by the photodetector. However, due to dark current passing through the photodetector, the photodetector may generate a second output signal that corresponds to the amount of incident radiation absorbed by the photodetector plus the amount of dark current passing through the photodetector. In some CMOS image sensors (e.g., time of flight sensors), the photodetectors generating electrical signals that do not correspond to the actual amount of incident radiation (e.g., near infrared (NIR) radiation having a wavelength between about 750 nanometers (nm) and about 2.5 micrometers (μm)) absorbed by the photodetector may negatively affect the precision of the CMOS image sensor in determining the distance an object is spaced from the CMOS image sensor.

In various embodiment, the present application is directed toward a CMOS image sensor having a second capping structure disposed between a first capping structure and an epitaxial structure. The CMOS image sensor comprises an epitaxial structure having a group IV chemical element disposed in a semiconductor substrate. The epitaxial structure extends into the semiconductor substrate from a first side of the semiconductor substrate. A photodetector is at least partially disposed in the epitaxial structure. A first capping structure covers the epitaxial structure on the first side of the semiconductor substrate. Further, the first capping structure comprises a second chemical element with a different energy band gap (e.g., larger or smaller) than the group IV chemical element. A second capping structure comprising the group IV chemical element and the second chemical element is disposed between the first capping structure and the epitaxial structure.

Because the second capping structure comprises the group IV chemical element and the second chemical element, a conduction band discontinuity (e.g., a difference in minimum conduction band energy) and/or a valance band discontinuity (e.g., a difference in maximum valance band energy) between the second capping structure and the epitaxial structure may be less than a conduction band discontinuity and/or a valance band discontinuity between the first capping structure and the epitaxial structure. Because the conduction band discontinuity and/or the valance band discontinuity between the second capping structure and the epitaxial structure may be less than the conduction band discontinuity and/or the valance band discontinuity between the first capping structure and the epitaxial structure, the amount of dark current in the photodetector may be reduced. Thus, performance of the CMOS image sensor may be improved.

FIG. 1 illustrates a cross-sectional view of some embodiments of a complementary metal-oxide-semiconductor (CMOS) image sensor 100 having a second capping structure disposed between a first capping structure and an epitaxial structure.

As shown in FIG. 1, the CMOS image sensor 100 comprises a semiconductor substrate 102. The semiconductor substrate 102 comprises a front-side 102f of the semiconductor substrate 102 and a back-side 102b of the semiconductor substrate 102 opposite the front-side 102f of the semiconductor substrate 102. In some embodiments, the semiconductor substrate 102 may comprise any type of semiconductor body (e.g., monocrystalline silicon/CMOS bulk, silicon-germanium (SiGe), silicon on insulator (SOI), etc.). In further embodiments, a first patterned dielectric layer 104 is disposed on the front-side 102f of the semiconductor substrate 102. In yet further embodiments, the first patterned dielectric layer 104 may comprise, for example, an oxide, a nitride, an oxy-nitride, or the like.

An epitaxial structure 106 is disposed in the semiconductor substrate 102. The epitaxial structure 106 extends into the semiconductor substrate 102 from the front-side 102f of the semiconductor substrate 102. The epitaxial structure 106 comprises a group IV chemical element (e.g., germanium, silicon, etc.). In some embodiments, the epitaxial structure 106 comprises a different group IV chemical element than the semiconductor substrate 102. In further embodiments, the epitaxial structure 106 comprises intrinsic (e.g., undoped) germanium.

A photodetector 107 is disposed at least partially in the epitaxial structure 106. The photodetector 107 is configured to absorb incident radiation 108 (e.g., photons) and to generate respective electrical signals corresponding to the incident radiation. In some embodiments, the photodetector 107 is configured to absorb incident radiation 108 having near infrared (NIR) wavelengths (e.g., between about 750 nanometers (nm) and about 2.5 micrometers (μm)). In some embodiments, the photodetector 107 may be, for example, a photodiode, a charge-couple device (CCD), a phototransistor, a photoresistor, or the like. In further embodiments, a micro-lens 110 is disposed on the back-side 102b of the semiconductor substrate 102. The micro-lens is configured to focus the incident radiation 108 (e.g., light) towards the photodetector 107.

A first capping structure 112 covers the epitaxial structure 106 on the front-side 102f of the semiconductor substrate 102. The first capping structure 112 comprises a chemical element, for example, a group IV chemical element (e.g., silicon, germanium, etc.). In some embodiments, the first capping structure 112 comprises crystalline silicon. In some embodiments, the first capping structure 112 comprises amorphous silicon. In further embodiments, the first capping structure 112 does not comprise the same group IV element as the epitaxial structure 106. In further embodiments, the first capping structure 112 has a different (e.g., larger or smaller) band gap than the epitaxial structure 106, which results in band discontinuity (e.g., a difference between the minimum conduction band energy and/or the maximum valence band energy of the first capping structure 112 and the epitaxial structure 106) between the first capping structure 112 and the epitaxial structure 106.

A second capping structure 114 is disposed between the first capping structure 112 and the epitaxial structure 106. The second capping structure 114 comprises the group IV chemical element of the epitaxial structure 106 and the chemical element of the first capping structure 112. In some embodiments, the second capping structure 114 comprises a crystalline silicon-germanium alloy (e.g., $Si_xGe_{x-1}$).

In some embodiments, a band gap of the second capping structure 114 may overlap the minimum conduction band energy and/or the maximum valence band energy of the first capping structure 112 and/or the epitaxial structure 106. In further embodiments, a conduction band discontinuity (e.g., a difference in minimum conduction band energy) between the second capping structure 114 and the epitaxial structure 106 may be less than a conduction band discontinuity between the first capping structure 112 and the epitaxial structure 106. In yet further embodiments, a valance band discontinuity (e.g., a difference in maximum valance band energy) between the second capping structure 114 and the epitaxial structure 106 may be less than a valance band discontinuity between the first capping structure 112 and the epitaxial structure 106. Because the conduction band discontinuity and/or the valance band discontinuity between the second capping structure 114 and the epitaxial structure 106 may be less than the conduction band discontinuity and/or the valance band discontinuity between the first capping structure 112 and the epitaxial structure 106, the amount of dark current in the photodetector 107 may be reduced. Thus, performance of the CMOS image sensor 100 may be improved.

In some embodiments, the second capping structure 114 may reduce the dark current in the photodetector 107 to below about 0.5 nanoamps (nA) or below about 1.0 nA. Absent the second capping structure 114, the dark current in the photodetector 107 may, for example, exceed this amount. By reducing the dark current in the photodetector 107 to below about 0.5 nA or below about 1.0 nA, the CMOS image sensor 100 may, for example, be used for time-of-flight sensor applications (e.g., an image sensor configured to determine the distance an object is spaced from the image sensor based on the known speed of light). If the dark current in the photodetector 107 were greater than about 1.0 nA, the photodetector 107 may not reliably measure time of flight due to the magnitude of the dark current.

Figure 2:
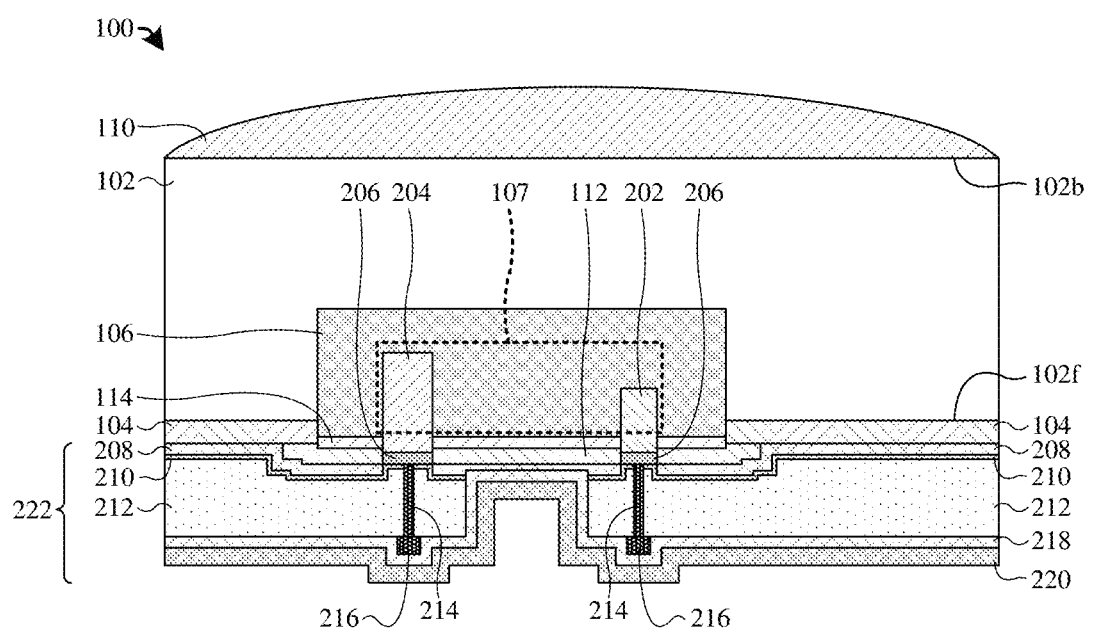
FIG. 2 illustrates a cross-sectional view of some more detailed embodiments of the CMOS image sensor of FIG. 1.

FIG. 2 illustrates a cross-sectional view of some more detailed embodiments of the CMOS image sensor 100 of FIG. 1.

As shown in FIG. 2, opposing sidewalls of the epitaxial structure 106 respectively contact the semiconductor substrate 102 and the first patterned dielectric layer 104. In some embodiments, the epitaxial structure 106 has a lower surface that is disposed between the front-side 102f of the semiconductor substrate 102 and a lower surface of the first patterned dielectric layer 104. In further embodiments, the epitaxial structure 106 contacts the second capping structure 114.

In some embodiments, opposing sidewalls of the second capping structure 114 respectively contact the first patterned dielectric layer 104 and the first capping structure 112. In some embodiment, opposing sidewalls of the second capping structure 114 may be substantially aligned with sidewalls of the epitaxial structure 106. The second capping structure 114 may have an upper surface disposed between an upper surface of the first patterned dielectric layer 104 and the lower surface of the first patterned dielectric layer 104. In some embodiments, the lower surface of the first patterned dielectric layer 104 is disposed between the front-side 102f of the semiconductor substrate 102 and a lower surface of the second capping structure 114. In further embodiments, the second capping structure 114 contacts the epitaxial structure 106, the first patterned dielectric layer 104, and the first capping structure 112. In yet further embodiments, the second capping structure may have a thickness between about 5 nm and about 25 nm or a thickness between about 5 nm and about 15 nm.

In some embodiments, the second capping structure 114 may have a concentration (e.g., by mass, volume, atoms, or some other metric) between about 20 percent and 70 percent for the first group IV chemical element (e.g., germanium or some other element). In such an embodiment, the second capping structure 114 may have a concentration between about 30 percent and 80 percent for the second chemical element (e.g., silicon or some other element). In some embodiments, the second capping structure 114 may be or comprise $Si_xGe_{1-x}$, where x is between about 0.2 and about 0.7. The concentration of the group IV chemical element and/or the second chemical element in the second capping structure 114 may be substantially the same from a lower surface of the second capping structure 114 to an upper surface of the second capping structure 114.

In other embodiments, a concentration of the group IV chemical element in the second capping structure 114 may increase along a gradient (e.g., continuously or discretely) from a first concentration near the lower surface of the second capping structure 114 to a second concentration near the upper surface of the second capping structure 114. A concentration of the second chemical element in the second capping structure 114 may increase along a gradient (e.g., continuously or discretely) from a third concentration near the upper surface of the second capping structure 114 to a fourth concentration near the lower surface of the second capping structure 114. In such an embodiment, the first concentration of the group IV chemical element may be about 1 percent near the lower surface of the second capping structure 114, and a second concentration of the group IV chemical element may be about 99 percent near the upper surface of the second capping structure 114. In further such embodiments, a third concentration of the second chemical element may be about 99 percent near the lower surface of the second capping structure 114, and a fourth concentration of the second chemical element may be about 1 percent near the upper surface of the second capping structure 114. In some embodiments, the second capping structure 114 may be or comprise $Si_xGe_{1-x}$, and x may increase (e.g., continuously or discretely) from about 1.0 at or near the lower surface of the second capping structure 114 to about 0.0 at or near the upper surface of the second capping structure 114.

In some embodiments, the first capping structure 112 contacts the second capping structure 114 and the first patterned dielectric layer 104. The first capping structure 112 may contact the first patterned dielectric layer 104 on opposing sidewalls of the epitaxial structure 106. In some embodiments, the first capping structure 112 may have sidewalls that are respectively disposed beyond sidewalls of the second capping structure 114. In further embodiments, the first capping structure 112 has a first lower surface that is disposed between a second lower surface of the first capping structure 112 and the second capping structure 114. In such an embodiment, the first lower surface may be disposed beyond sidewalls of the second capping structure 114. In yet further embodiments, the first capping structure 112 may have a thickness between about 20 nm and about 100 nm.

Also shown in FIG. 2, a first doped region 202 and a second doped region 204 are disposed at least partially in the epitaxial structure 106 and laterally spaced apart. The first doped region 202 and the second doped region 204 are adjoining regions of one or more doped (e.g., n-type doping or p-type doping) semiconductor materials, respectively. In some embodiments, the first doped region 202 comprises a first doping type (e.g., n-type doping) and the second doped region 204 comprises a second doping type (e.g., p-type doping) opposite the first doping type. In some embodiments, the first doped region 202 and/or the second doped region 204 extend beneath a lower surface of the epitaxial structure 106. In such an embodiment, the first doped region 202 and/or the second doped region 204 may be at least partially disposed in the second capping structure 114 and/or the first capping structure 112.

In some embodiments, the photodetector 107 may comprise the first doped region 202, the second doped region 204, and a portion of the epitaxial structure 106 between the first doped region 202 and the second doped region 204. In such an embodiment, the photodetector may be a PIN photodiode (e.g., an intrinsic semiconductor material disposed between a p-type semiconductor material and an n-type semiconductor material). The photodetector 107 may be reverse-biased (e.g., applying a negative voltage to the second doped region and a positive voltage to the first doped region) to form a depletion region in the epitaxial structure 106, such that the depletion region absorbs incident radiation (e.g., photons). The photodetector 107 outputs an electric signal corresponding to the absorbed incident radiation. In further embodiments, about positive 1.5 volts (V) to about positive 3 volts may be applied to the first doped region 202, and about 0 V (e.g., ground) to about negative 3 V may be applied to the second doped region 204.

Silicide structures 206 may respectively be disposed on the first doped region 202 and the second doped region 204. In some embodiments, upper surfaces of the silicide structures 206 are disposed between a lower surface of the first capping structure 112 and an upper surface of the first capping structure 112. In other embodiments, the upper surface of the silicide structures 206 may be coplanar with the upper surface of the second capping structure 114 or disposed between the upper surface of the second capping structure 114 and the lower surface of the second capping structure 114. In further embodiments, lower surfaces of the silicide structures 206 may be coplanar with the lower surface of the first capping structure 112 or disposed beneath the lower surface of the first capping structure 112.

A second patterned dielectric layer 208 is disposed on the first capping structure 112 and the first patterned dielectric layer 104. In some embodiments, the first capping structure 112 separates the second patterned dielectric layer 208 from the second capping structure 114. In some embodiments, the second patterned dielectric layer 208 may have a first lower surface disposed between a second lower surface and a third lower surface. In such an embodiment, the second lower surface may be partially disposed beneath the second capping structure 114, the first lower surface may be partially disposed beneath the first capping structure 112 and laterally spaced from the second capping structure 114, and the third lower surface may be disposed over the first patterned dielectric layer 104 and laterally spaced from the second capping structure 114 and the first capping structure 112. In further embodiments, the second patterned dielectric layer 208 may comprise, for example, an oxide, a nitride, an oxy-nitride, or the like.

A contact etch stop layer (CESL) 210 is disposed on the second patterned dielectric layer 208. In some embodiments, the CESL 210 may have a first lower surface disposed between a second lower surface and a third lower surface. In such an embodiment, the second lower surface may be partially disposed beneath the second capping structure 114, the first lower surface may be partially disposed beneath the first capping structure 112 and laterally spaced from the second capping structure 114, and the third lower surface may be disposed over the first patterned dielectric layer 104 and laterally spaced from the second capping structure 114 and the first capping structure 112.

In further embodiments, the CESL 210 is disposed at least partially on each of the silicide structures 206. In such an embodiment, the CESL 210 may have a fourth lower surface and a fifth lower surface respectively disposed over the silicide structures 206 and between the second lower surface of the CESL 210 and the third lower surface of the CESL 210. In other embodiments, the fourth and fifth lower surfaces may be coplanar with the second lower surface of the CESL 210 or be disposed beneath the second lower surface of the CESL 210. In yet further embodiments, the CESL 210 may comprise, for example, a nitride, an oxide, a carbide, or the like.

An interlayer dielectric (ILD) layer 212 is disposed on the CESL 210. In some embodiments, an upper surface of the ILD layer 212 may conformally line the lower surfaces of the CESL 210. In further embodiments, the ILD layer 212 may have a substantially planar lower surface. In yet further embodiments, the ILD layer 212 may comprise one or more of a low-k dielectric layer (e.g., a dielectric with a dielectric constant less than about 3.9), an ultra-low-k dielectric layer, or an oxide (e.g., SiO$_2$).

A plurality of conductive contacts 214 are disposed in the ILD layer 212. In some embodiments, the conductive contacts 214 extend through the ILD layer 212 and the CESL 210 to respectively contact the silicide structures 206. In some embodiments, a plurality of conductive features 216 (e.g., conductive lines and conductive vias) are disposed on the lower surface of the ILD layer 212. In some embodiments, the ILD layer 212 may have a pair of sidewalls disposed between a first conductive contact 214 coupled to the silicide structure 206 disposed on the first doped region 202 and a second conductive contact 214 coupled to the silicide structure 206 disposed on the second doped region 204. The pair of sidewalls of the ILD layer 212 may define sides of an opening in the ILD layer 212. The opening may be disposed in the ILD layer 212 to reduce the amount of incident radiation the ILD layer 212 absorbs, which may reduce the amount of noise in the electrical signals output by the photodetector 107.

In some embodiments, a third dielectric layer 218 is disposed on the ILD layer 212 and the conductive features 216. The third dielectric layer 218 may conformally line the ILD layer 212 and the conductive features 216. In some embodiments, the third dielectric layer 218 may extend along the pair of sidewalls of the ILD layer 212. In some embodiments, the third dielectric layer 218 may extend along the pair of sidewalls of the ILD layer 212 through the CESL 210 and into the second patterned dielectric layer 208, such that the third dielectric layer 218 contacts the second patterned dielectric layer 208, the CESL 210, and the ILD layer 212. In further embodiments, the third dielectric layer 218 may comprises, for example, an oxide, a nitride, an oxy-nitride, or the like.

In some embodiments, a passivation layer 220 is disposed on the third dielectric layer 218. In some embodiments, the passivation layer 220 may conformally line the third dielectric layer 218. In further embodiments, the passivation layer 220 may comprise a nitride, an oxide, an oxy-nitride, a polymer, or the like. In yet further embodiments, the second patterned dielectric layer 208, the CESL 210, the ILD layer 212, the third dielectric layer 218, and the passivation layer 220 may be part of an interconnect structure 222. The interconnect structure 222 is configured to provide electrical connections between various devices disposed on the semiconductor substrate 102 and/or input/output structures (not shown) (e.g., contact pads, solders bumps, etc.) disposed on the passivation layer 220.

Figure 3:
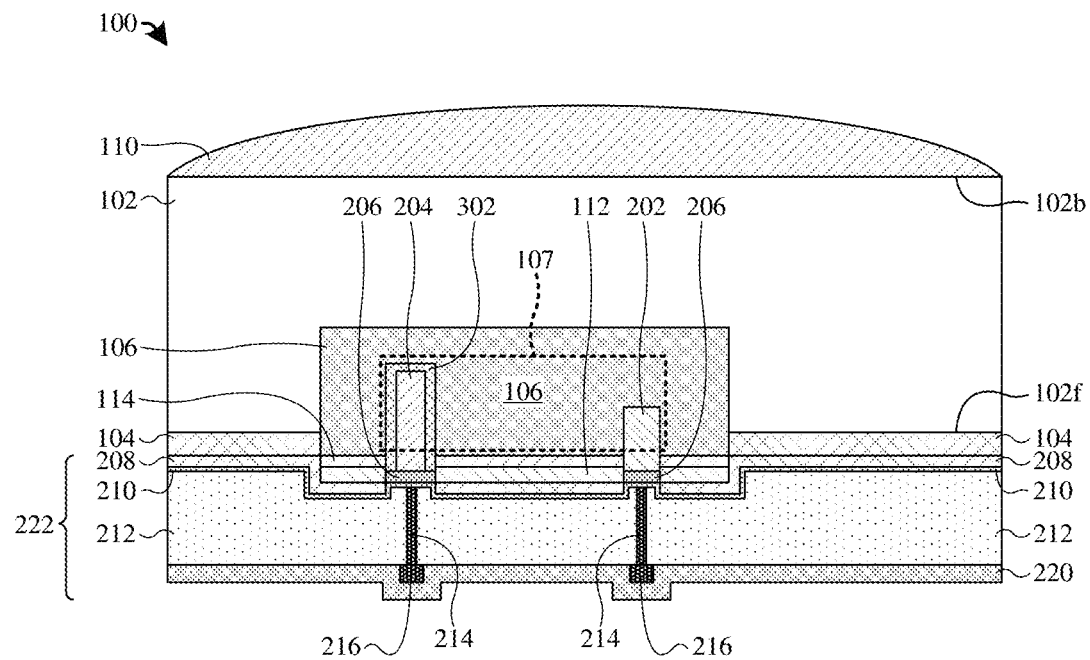
FIG. 3 illustrates a cross-sectional view of some alternative embodiments of the CMOS image sensor of FIG. 2.

FIG. 3 illustrates a cross-sectional view of some alternative embodiments of the CMOS image sensor 100 of FIG. 2.

As shown in FIG. 3, a third doped region 302 is at least partially disposed in the epitaxial structure 106. In some embodiments, the third doped region 302 is disposed along opposing sides of the second doped region 204 and between the second doped region 204 and the back-side 102b of the semiconductor substrate 102. In some embodiments, the third doped region 302 comprises the first doping type (e.g., n-type doping). In further embodiments, the third doped region 302 may extend beneath the lower surface of the epitaxial structure 106. In such an embodiment, the third doped region 302 may be at least partially disposed in the second capping structure 114 and/or the first capping structure 112. In yet further embodiments, one of the silicide structures 206 may be disposed on the second doped region 204 and the third doped region 302.

Also shown in FIG. 3, the lower surface of the epitaxial structure 106 is coplanar with the lower surface of the first patterned dielectric layer 104. In some embodiments, the first capping structure 112 has sidewalls that are substantially aligned with sidewalls of the second capping structure 114. In further embodiments, the second patterned dielectric layer 208 may contact the first capping structure 112, the second capping structure 114, and the first patterned dielectric layer 104. In yet further embodiments, the passivation layer 220 may contact the ILD layer 212 and the conductive features 216.

Figure 4:
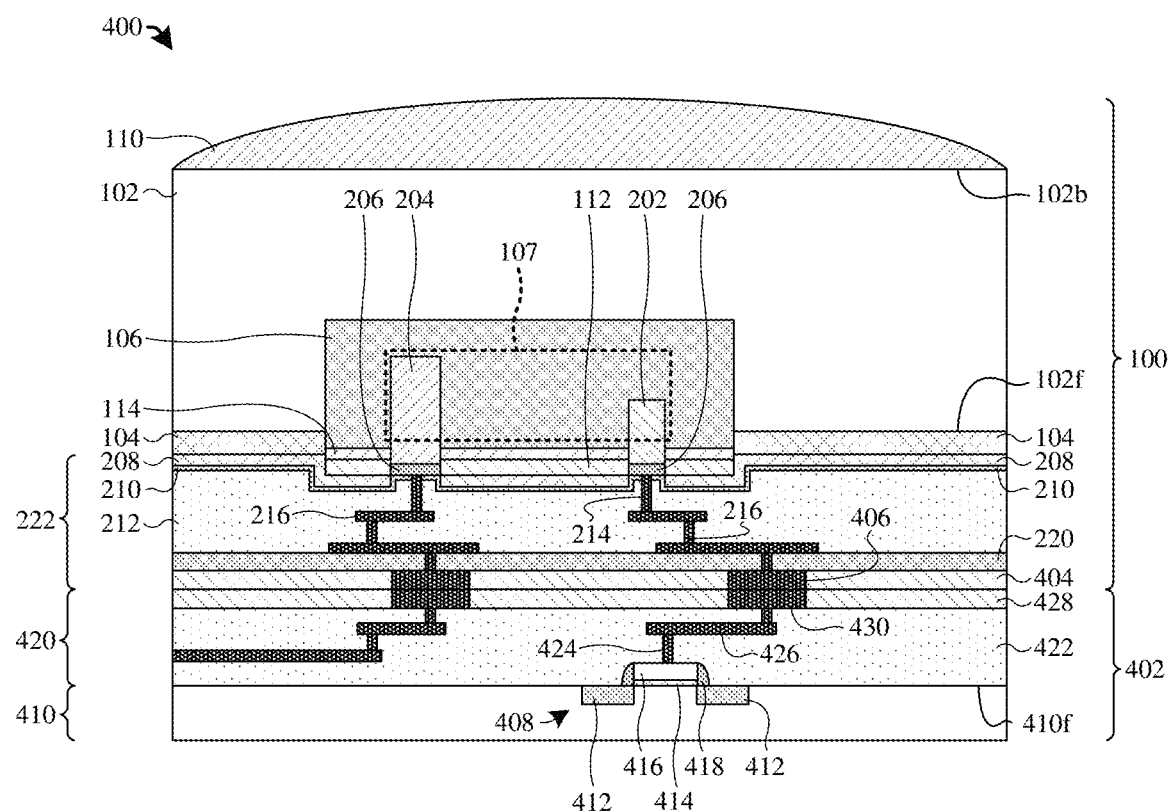
FIG. 4 illustrates a cross-sectional view of some embodiments of a stacked CMOS image sensor comprising some more detailed embodiments of the CMOS image sensor of FIG. 1 coupled to a logic device.

FIG. 4 illustrates a cross-sectional view of some embodiments of a stacked CMOS image sensor 400 comprising some more detailed embodiments of the CMOS image sensor 100 of FIG. 1 coupled to a logic device 402.

As shown in FIG. 4, the interconnect structure 222 comprises a first bonding structure 404 disposed on the passivation layer 220. In some embodiments, the first bonding structure 404 may be disposed on the ILD layer 212. A plurality of CMOS image sensor contact pads 406 are disposed in the first bonding structure 404 and electrically coupled to the plurality of conductive features 216. In further embodiments, the CMOS image sensor contact pads 406 may comprise, for example, aluminum, gold, copper, or the like. In yet further embodiments, the first bonding structure 404 may, for example, an oxide, a nitride, a polymer, or the like.

In some embodiments, the CMOS image sensor 100 may be a time-of-flight sensor configured to determine the distance an object is spaced from the CMOS image sensor based on the known speed of light. For example, a light pulse generator (not shown) disposed on or near the CMOS image sensor 100 may project a light pulse (e.g., NIR radiation) onto an object. Based on the time difference between the time the light pulse was projected and the time the photodetector 107 absorbs the reflected light pulse, the distance the object is spaced from the CMOS image sensor 100 may be determined.

The logic device 402 comprises a semiconductor device 408 (e.g., a metal-oxide-semiconductor field-effect transistor (MOSFET)). In some embodiments, the logic device 402 is an application-specific integrated circuit (ASIC) configured to process electrical signals received from the CMOS image sensor 100. The semiconductor device 408 may be disposed on a front-side 410$f$ of a second semiconductor substrate 410. In some embodiments, the semiconductor device 408 comprises a pair of source/drain regions 412 disposed in the second semiconductor substrate 410. In further embodiments, the semiconductor device 408 comprises a gate dielectric 414 disposed on the front-side 410$f$ of the second semiconductor substrate 410, and a gate electrode 416 disposed on the gate dielectric 414. In yet further embodiments, sidewall spacers 418 may be disposed on opposing sides of the gate electrode 416 and the gate dielectric 414.

A second interconnect structure 420 is disposed on the front-side 410$f$ of the second semiconductor substrate 410. The second interconnect structure 420 comprises a second ILD layer 422 disposed on the front-side 410$f$ of the second semiconductor substrate 410. In some embodiments, the second ILD layer 422 may comprise one or more layers of a low-k dielectric, an ultra-low-k dielectric, an oxide, or the like. In some embodiments, logic device conductive contacts 424 are disposed in the second ILD layer 422. In further embodiments, the logic device conductive contacts 424 extend from the gate electrode 416 and the pair of source/drain regions 412 to a plurality of logic device conductive features 426 (e.g., conductive lines and conductive vias) disposed in the second ILD layer 422.

In some embodiments, the second interconnect structure 420 comprises a second bonding structure 428 disposed on the second ILD layer 422. A plurality of logic device contact pads 430 are disposed in the second bonding structure 428 and are electrically coupled to the plurality of logic device conductive features 426. In further embodiments, the second bonding structure 428 and/or the logic device contact pads 430 are respectively bonded (e.g., eutectic bonding, hybrid bonding, etc.) to the first bonding structure 404 and/or the CMOS image sensor contact pads 406, such that the semiconductor device 408 is electrically coupled to the photodetector 107 of the CMOS image sensor 100 via the interconnect structure 222 and the second interconnect structure 420. In yet further embodiments, the first doped region 202 of the photodetector 107 may be electrically coupled to the gate electrode 416 of the semiconductor device 408 via the interconnect structure 222 and the second interconnect structure 420.

FIGS. 5-19 illustrate a series of cross-sectional views of some embodiments of a method for forming a stacked CMOS image sensor 400 comprising some more detailed embodiments of the CMOS image sensor 100 of FIG. 1 coupled to a logic device 402.

Figure 5:
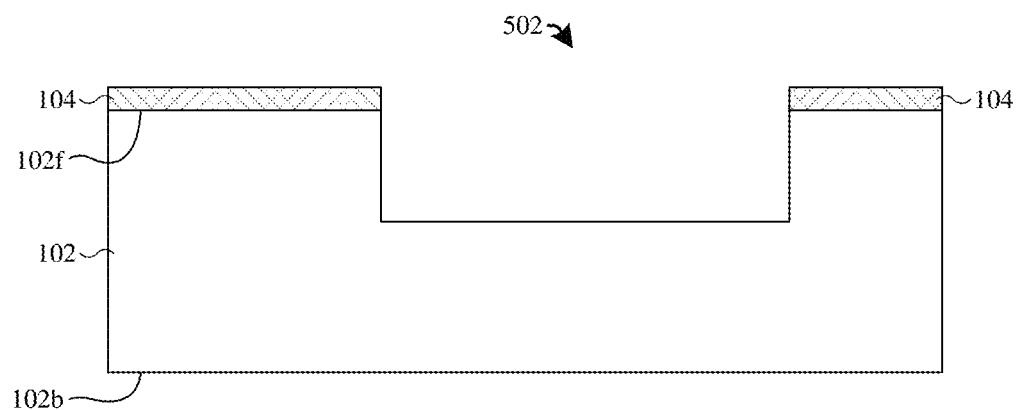
FIGS. 5-19 illustrate a series of cross-sectional views of some embodiments of a method for forming a stacked CMOS image sensor comprising some more detailed embodiments of the CMOS image sensor of FIG. 1 coupled to a logic device.

As shown in FIG. 5, a trench 502 is formed in a semiconductor substrate 102. In some embodiments, the trench 502 extends into the semiconductor substrate 102 from a front-side 102$f$ of the semiconductor substrate 102. In further embodiments, the trench 502 extends through a first patterned dielectric layer 104 that is disposed on the front-side 102$f$ of the semiconductor substrate 102.

In some embodiments, a process for forming the trench 502 comprises performing an etch (e.g., a dry etch and/or a wet etch) into the semiconductor substrate 102. In some embodiments, the etch may be performed with a patterned masking layer (not shown) formed on the front-side 102$f$ of the semiconductor substrate 102. Subsequently, the front-side 102$f$ of the semiconductor substrate 102 is exposed to an etchant that removes portions of the semiconductor substrate 102 not covered by the masking layer to form the trench 502. In further embodiments, the etch may be performed with a first dielectric layer (not shown) disposed on the front-side 102$f$ of the semiconductor substrate 102. In such an embodiment, the etch to form the trench 502 may remove portions of the first dielectric layer not covered by the masking layer (not shown) to form the first patterned dielectric layer 104. In yet further embodiments, the first dielectric layer may be deposited and/or grown on the front-side 102$f$ of the semiconductor substrate 102 by, for example, chemical vapor deposition (CVD), physical vapor deposition (PVD), atomic layer deposition (ALD), thermal oxidation, sputtering, or the like.

Figure 6:
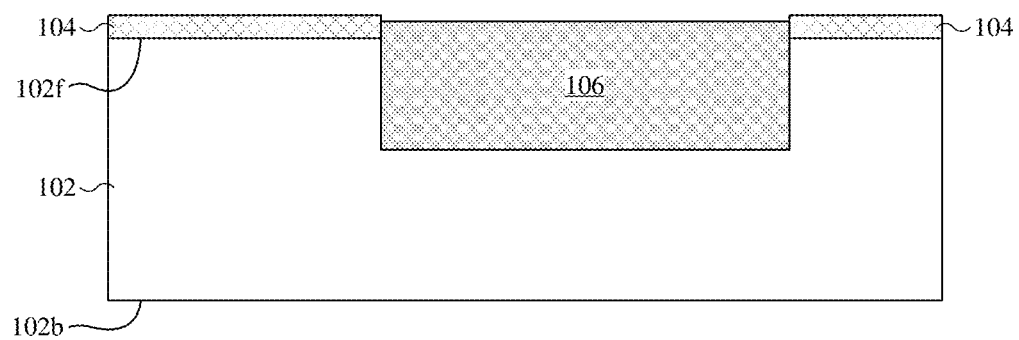

As shown in FIG. 6, an epitaxial structure 106 is formed in the trench 502. The epitaxial structure 106 comprises a group IV chemical element (e.g., germanium). In some embodiments, the epitaxial structure 106 may be formed with a front-side surface disposed between the front-side 102$f$ of the semiconductor substrate 102 and a front-side surface of the first patterned dielectric layer 104. In further embodiments, the epitaxial structure 106 may be formed by, for example, vapor-phase epitaxy (VPE), molecular-beam epitaxy (MBE), liquid-phase epitaxy (LPE), solid-phase epitaxy (SPE), reduced pressure chemical vapor deposition (RP-CVD) epitaxy, metalorganic vapor phase epitaxy (MOVPE), or the like.

Figure 7:
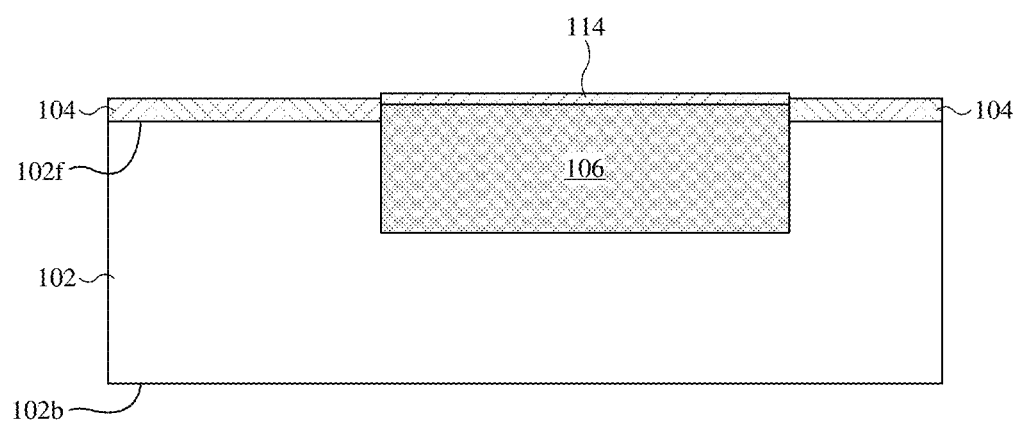

As shown in FIG. 7, a second capping structure 114 is formed on the epitaxial structure 106. The second capping structure 114 comprises the same group IV chemical element as the epitaxial structure 106 and a second chemical element. In some embodiments, the second chemical element may be, for example, a different group IV chemical element (e.g., silicon) than the group IV chemical element of the epitaxial structure 106. In further embodiments, the second capping structure 114 may be formed with a front-side surface disposed over the front-side surface of the first patterned dielectric layer 104.

In some embodiments, the second capping structure 114 may be formed by CVD, PVD, ALD, VPE, MBE, LPE, SPE, RP-CVD, MOVPE, or the like. In further embodiments, the second capping structure 114 may be formed in a processing chamber having a silicon precursor (e.g., silane ($SiH_4$) gas, dichlorosilane (DCS) gas, etc.) and/or a germanium precursor (e.g., germane ($GeH_4$) gas) pumped into the processing chamber. In further embodiments, a flow ratio of the germanium precursor to the silicon precursor may be between about 1.6 and about 3.5. In yet further embodiments, the second capping structure 114 is selectively formed on the epitaxial structure 106, such that the second capping structure 114 is formed with sidewalls that are substantially aligned with sidewalls of the epitaxial structure 106.

Figure 8:
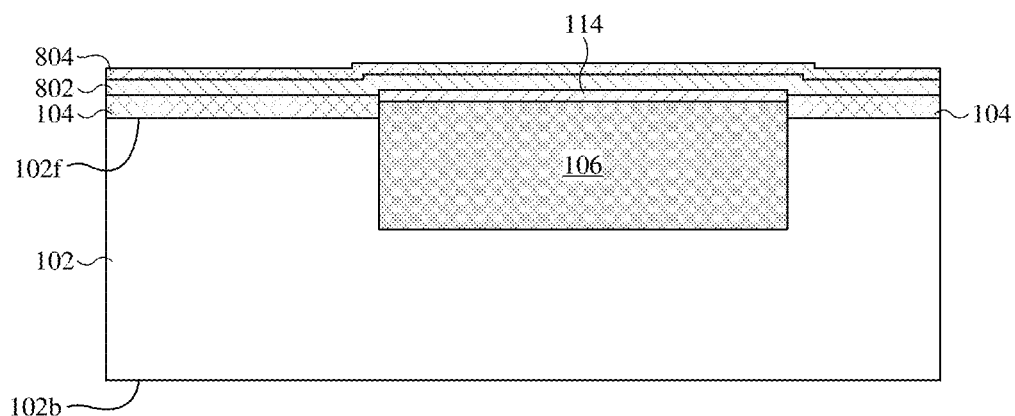

As shown in FIG. 8, a first capping layer 802 is formed on the first patterned dielectric layer 104 and the second capping structure 114. The first capping layer 802 comprises the same second chemical element as the second capping structure 114. In some embodiments, the first capping layer 802 does not comprise the same group IV element as the epitaxial structure 106. In further embodiments, the first capping layer 802 conformally lines the first patterned dielectric layer 104 and the second capping structure 114. In further embodiments, the first capping layer 802 has a different band gap than the epitaxial structure 106, which results in band discontinuity (e.g., a difference between the minimum conduction band energy and/or the maximum valence band energy of the first capping structure 112 and the epitaxial structure 106) between the first capping structure 112 and the epitaxial structure 106. In yet further embodiments, the first capping layer 802 may be formed by CVD, PVD, ALD, VPE, MBE, LPE, SPE, RP-CVD, MOVPE, or the like.

While not shown, in other embodiments, the second capping structure 114 may be formed after the first capping layer 802. In such an embodiment, the second capping structure 114 may not be formed (e.g., by epitaxy) at FIG. 7. Instead, the first capping layer 802 may be formed on the epitaxial structure 106. Thereafter, an anneal is performed to promote atoms of the first capping layer 802 and atoms of the epitaxial structure 106 to inter diffuse at an interface at which the first capping layer 802 contacts the epitaxial structure 106, thereby forming the second capping structure 114 from the inter diffused atoms between the first capping layer 802 and the epitaxial structure 106. The anneal may be, for example, performed at a temperature between about 700-850 degrees Celsius.

Also shown in FIG. 8, a second dielectric layer 804 is formed on the first capping layer 802. In some embodiments, the second dielectric layer 804 may conformally line the first capping layer 802. In further embodiments, the second dielectric layer 804 comprises for example, an oxide, a nitride, an oxy-nitride, or the like. In yet further embodiments, the second dielectric layer 804 may be formed by, for example, CVD, PVD, ALD, thermal oxidation, sputtering, or the like.

Figure 9:
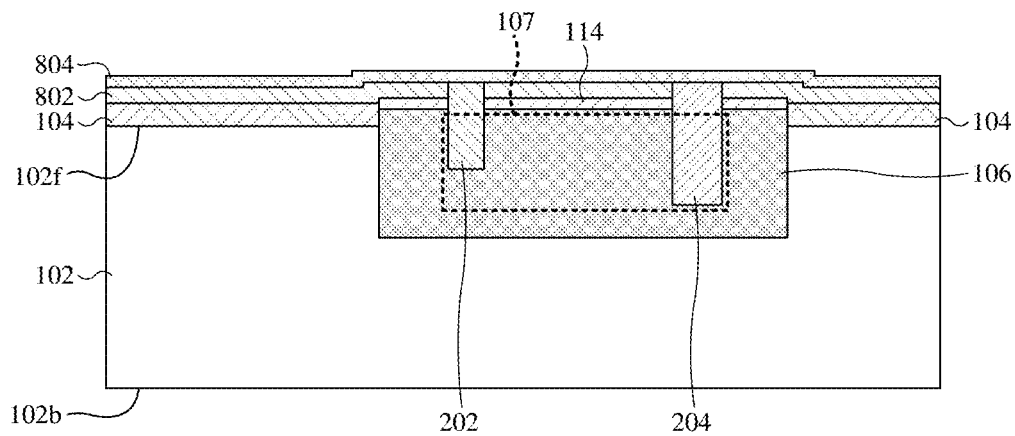

As shown in FIG. 9, a first doped region 202 and a second doped region 204 are formed laterally spaced from one another in the epitaxial structure 106. In some embodiments, the first doped region 202 and the second doped region 204 are formed with the first capping layer 802 and the second dielectric layer 804 stacked over the semiconductor substrate 102. In such an embodiment, the first doped region 202 and the second doped region 204 respectively extend into the second capping structure 114 and the first capping layer 802. In further such an embodiment, the first doped region 202 comprises adjoining regions of the epitaxial structure 106, the second capping structure 114, and the first capping layer 802 that have a first doping type (e.g., n-type doping), and the second doped region 204 comprises adjoining regions of the epitaxial structure 106, the second capping structure 114, and the first capping layer 802 that have a second doping type (e.g., p-type doping) different than the first doping type. In further embodiments, the first doped region 202 and the second doped region 204 may be formed by an ion implantation process and may utilize one or more masking layers (not shown) to selectively implant ions into the epitaxial structure 106, second capping structure 114, and the first capping layer 802. In yet further embodiments, a photodetector 107 may comprise the first doped region 202, the second doped region 204, and a portion of the epitaxial structure 106 between the first doped region 202 and the second doped region 204.

Figure 10:
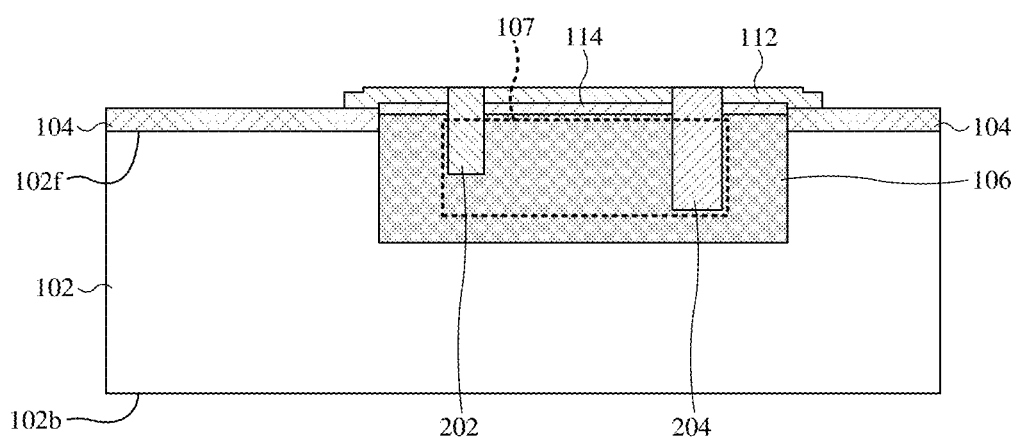

As shown in FIG. 10, the first capping layer 802 is patterned into a first capping structure 112 and the second dielectric layer 804 is removed. In some embodiments, a process for removing the second dielectric layer 804 may comprise etching the second dielectric layer 804 and/or performing a planarization process (e.g., a chemical-mechanical planarization (CMP)) into the second dielectric layer 804 to expose the first capping layer 802. In further embodiments, a process for patterning the first capping layer 802 into the first capping structure 112 comprises forming a masking layer (not shown) on the first capping layer 802. In some embodiments, the masking layer may be formed by a spin on process and patterned using photolithography. In further embodiments, the process comprises performing an etch into the first capping layer 802 with the patterned masking layer in place, and subsequently stripping the patterned masking layer. In yet further embodiments, the first capping layer 802 may be patterned into the first capping structure 112 before or after the second dielectric layer 804 is removed.

In some embodiments, a band gap of the second capping structure 114 may overlap the minimum conduction band energy and/or the maximum valence band energy of the first capping structure 112 and/or the epitaxial structure 106. In further embodiments, a conduction band discontinuity (e.g., a difference in minimum conduction band energy) between the second capping structure 114 and the epitaxial structure 106 may be less than a conduction band discontinuity between the first capping structure 112 and the epitaxial structure 106. In yet further embodiments, a valance band discontinuity (e.g., a difference in maximum valance band energy) between the second capping structure 114 and the epitaxial structure 106 may be less than a valance band discontinuity between the first capping structure 112 and the epitaxial structure 106. Because the conduction band discontinuity and/or the valance band discontinuity between the second capping structure 114 and the epitaxial structure 106 may be less than the conduction band discontinuity and/or the valance band discontinuity between the first capping structure 112 and the epitaxial structure 106, the amount of dark current in the photodetector 107 may be reduced. Thus, performance of the CMOS image sensor 100 may be improved.

Figure 11:
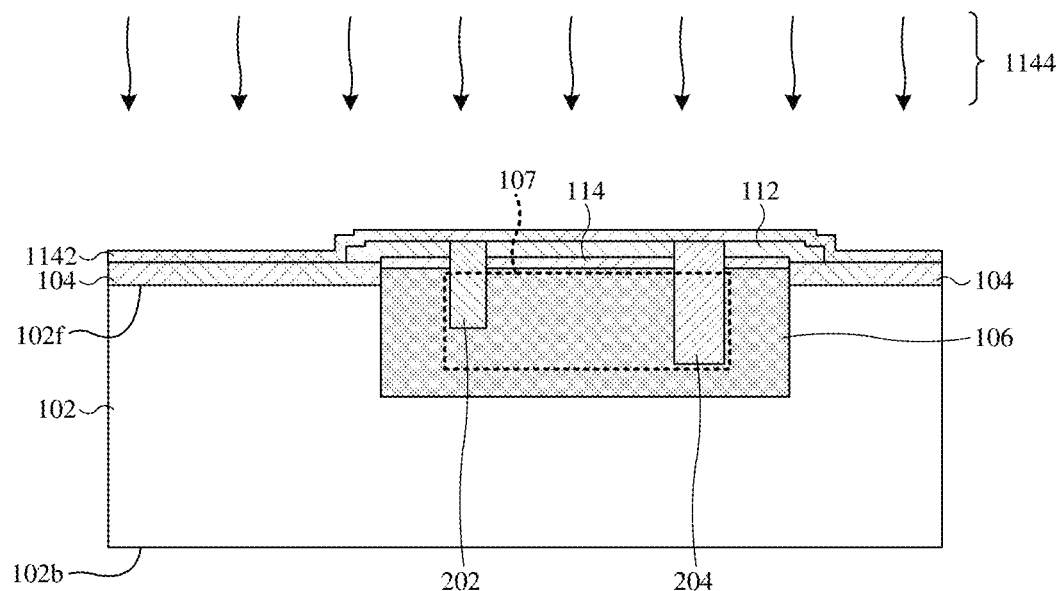

As shown in FIG. 11, a third dielectric layer 1142 is formed on the first patterned dielectric layer 104, the first capping structure 112, the first doped region 202, and the second doped region 204. In some embodiments, the third dielectric layer 1142 comprises for example, an oxide, a nitride, an oxy-nitride, or the like. In further embodiments, the third dielectric layer 1142 may conformally line the first patterned dielectric layer 104, the first capping structure 112, the first doped region 202, and the second doped region 204. In yet further embodiments, the third dielectric layer 1142 may be formed by, for example, CVD, PVD, ALD, thermal oxidation, sputtering, or the like. Further, an anneal 1144 (e.g., rapid thermal anneal (RTA), microwave anneal, furnace anneal, etc.) is performed on the semiconductor substrate 102. The anneal 1144 is configured to activate the dopants of the first doped region 202 and the second doped region 204.

Figure 12:
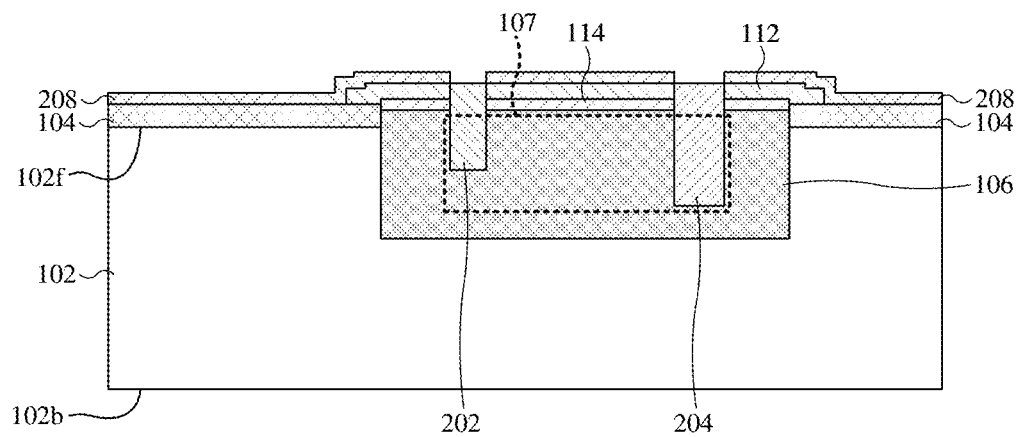

As shown in FIG. 12, the third dielectric layer 1142 is patterned into a second patterned dielectric layer 208. The second patterned dielectric layer 208 comprise a plurality of openings that respectively expose the first doped region 202 and the second doped region 204. In some embodiments, a process for patterning the third dielectric layer 1142 into the second patterned dielectric layer 208 comprises forming a masking layer (not shown) on the third dielectric layer 1142. In some embodiments, the masking layer may be formed by a spin on process and patterned using photolithography. In further embodiments, the process comprises performing an etch into the third dielectric layer 1142 with the patterned masking layer in place, and subsequently stripping the patterned masking layer.

Figure 13:
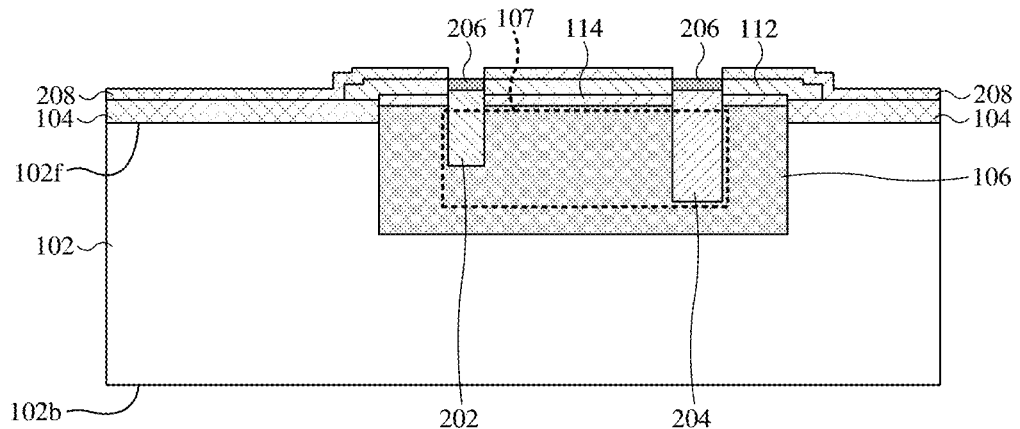

As shown in FIG. 13, silicide structures 206 are respectively formed on the first doped region 202 and the second doped region 204. In some embodiments, a process for forming the silicide structures 206 comprises depositing a metal layer (not shown) over the second patterned dielectric layer 208, the first doped region 202, and the second doped region 204. In some embodiments, the metal layer may comprise, for example, nickel, titanium, cobalt, tungsten, or some other electropositive element. An anneal process (e.g., a RTA) is performed with the metal layer in place, such that the metal layer reacts with the first capping structure 112 to form the silicide structures 206. Subsequently, the non-reacted portions of the metal layer are stripped away.

Figure 14:
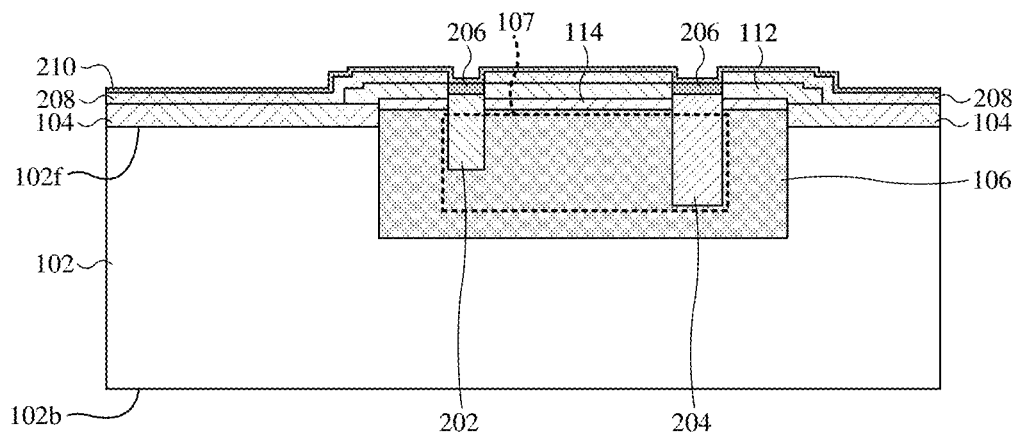
Figure 15:
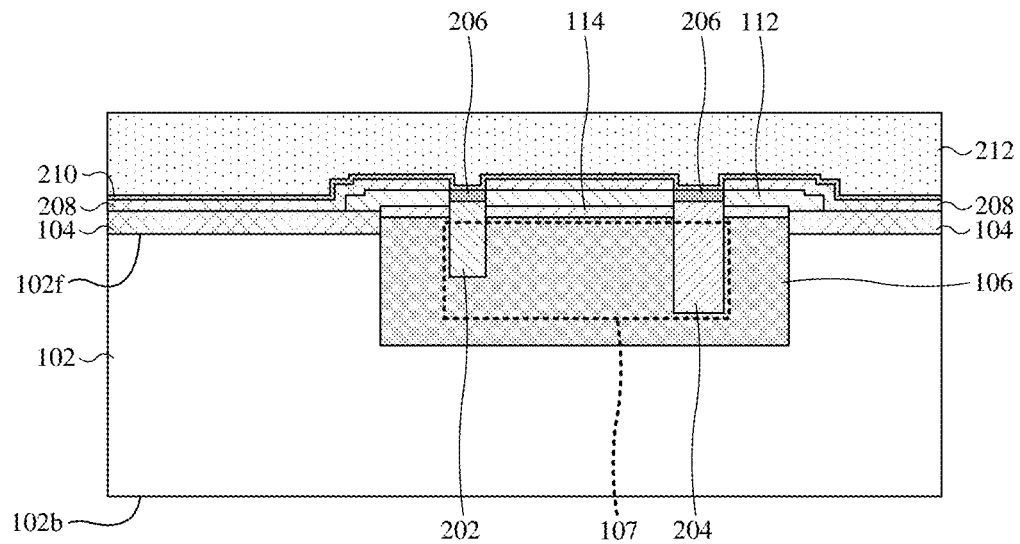

As shown in FIG. 14, a contact etch stop layer (CESL) 210 is formed on the second patterned dielectric layer 208 and the silicide structures 206. In some embodiments, the CESL 210 may conformally line the second patterned dielectric layer 208 and the silicide structures 206. In further embodiments, the CESL 210 may be formed by, for example, CVD, PVD, ALD, sputtering, or the like.

As shown in FIG. 5, an interlayer dielectric (ILD) layer 212 is formed on the CESL 210. In some embodiments, the ILD layer 212 may comprise one or more layers of a low-k dielectric layer, an ultra-low-k dielectric layer, an oxide, or the like. In further embodiments, the ILD layer 212 may be deposited by, for example, CVD, PVD, ALD, sputtering, or the like. In yet further embodiments, a planarization process (e.g., CMP) may be performed on the ILD layer 212 to form a substantially planar front-side surface.

Figure 16:
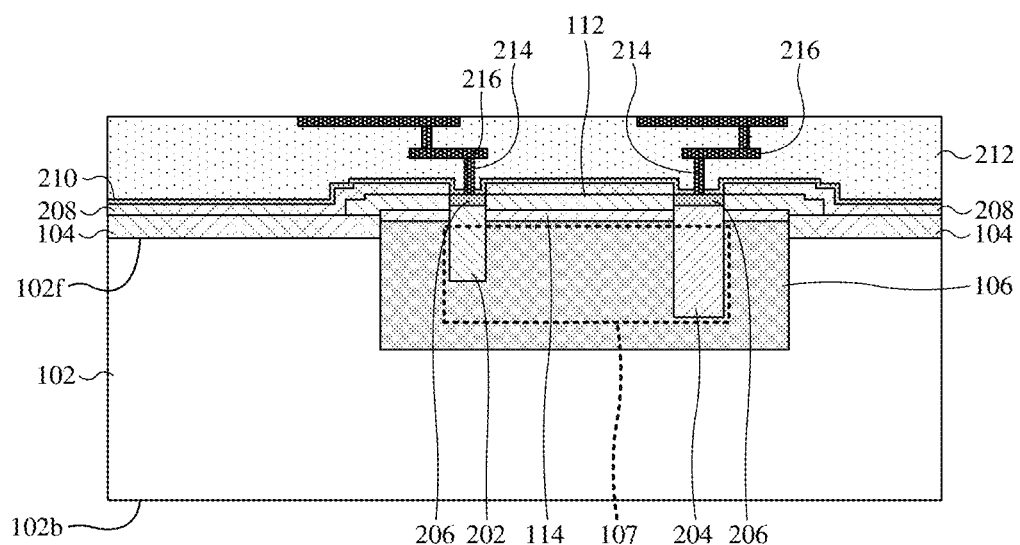

As shown in FIG. 16, conductive contacts 214 are formed in the ILD layer 212. In some embodiments, a process for forming the conductive contacts 214 comprises performing a first etch into the ILD layer 212 to form contact openings that correspond to the conductive contacts 214. In some embodiments, the etch may be performed with a patterned masking layer formed over the ILD layer 212. In further embodiments, the process comprises filling the contact openings with a conductive material (e.g., tungsten). In yet further embodiments, the contact openings may be filled by depositing or growing (e.g., by CVD, PVD, ALD, sputtering, electrochemical plating, electroless plating, etc.) a conductive layer covering the ILD layer 212 that fills the contact openings, and subsequently performing a planarization process (e.g., CMP) on the ILD layer 212. In various embodiments, the process may be part of a single damascene like process or a dual damascene like process.

Also shown in FIG. 16, a plurality of conductive features 216 (e.g., conductive lines and conductive vias) are formed in the ILD layer 212. In some embodiments, the conductive features 216 may be formed in one or more inter-metal dielectric (IMD) layers (not shown) stacked on the ILD layer 212. In some embodiments, a process for forming the conductive features comprises performing an etch into the ILD layer 212 (or an IMD layer) to form conductive feature openings. In some embodiments, the etch may be performed with a patterned masking layer formed over the ILD layer 212 (or the IMD layer). In further embodiments, the process comprises filling the conductive feature openings with a conductive material (e.g., copper, aluminum, etc.). In yet further embodiments, the openings may be filled by depositing or growing (e.g., by CVD, PVD, ALD, sputtering, electrochemical plating, electroless plating, etc.) a conductive layer covering the ILD layer 212 (or the IMD layer) that fills the conductive feature openings, and subsequently performing a planarization (e.g., CMP) on the ILD layer 212 (or the IMD layer).

Figure 17:
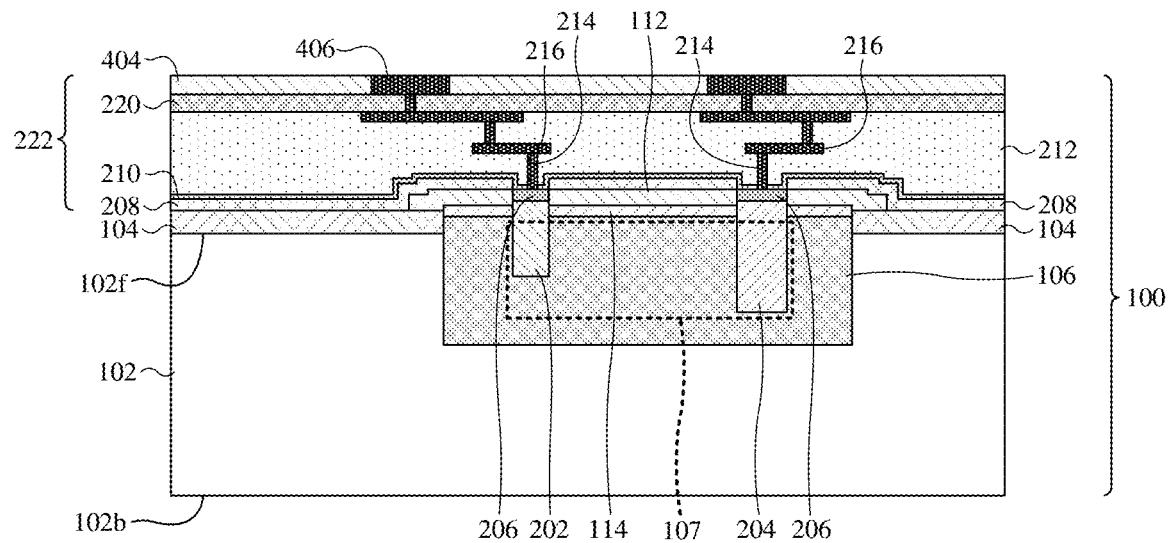

As shown in FIG. 17, a passivation layer 220 is formed on the ILD layer 212 and some of the conductive features 216. In some embodiments, the passivation layer 220 may comprise, for example, an oxide, a nitride, an oxy-nitride, a polymer, or the like. In further embodiment, the passivation layer 220 may be formed by CVD, PVD, ALD, sputtering, a spin on process, or the like.

Also shown in FIG. 17, a first bonding structure 404 and a plurality of CMOS image sensor contact pads 406 are formed on the passivation layer 220. In some embodiments, a process for forming the first bonding structure 404 and the CMOS image sensor contact pads 406 comprises growing or depositing (e.g., by CVD, PVD, ALD, sputtering, a spin on process, etc.) the first bonding structure 404 on the passivation layer 220. Subsequently, the first bonding structure 404 may be etched to form openings in the first bonding structure 404 corresponding to the CMOS image sensor contact pads 406. The openings are then filled with a conductive material (e.g., aluminum, gold, copper, or the like) to form the CMOS image sensor contact pads 406. In further embodiments, the second patterned dielectric layer 208, the CESL 210, the ILD layer 212, the passivation layer 220, the first bonding structure 404, and the CMOS image sensor contact pads 406 may be part of an interconnect structure 222.

Figure 18:
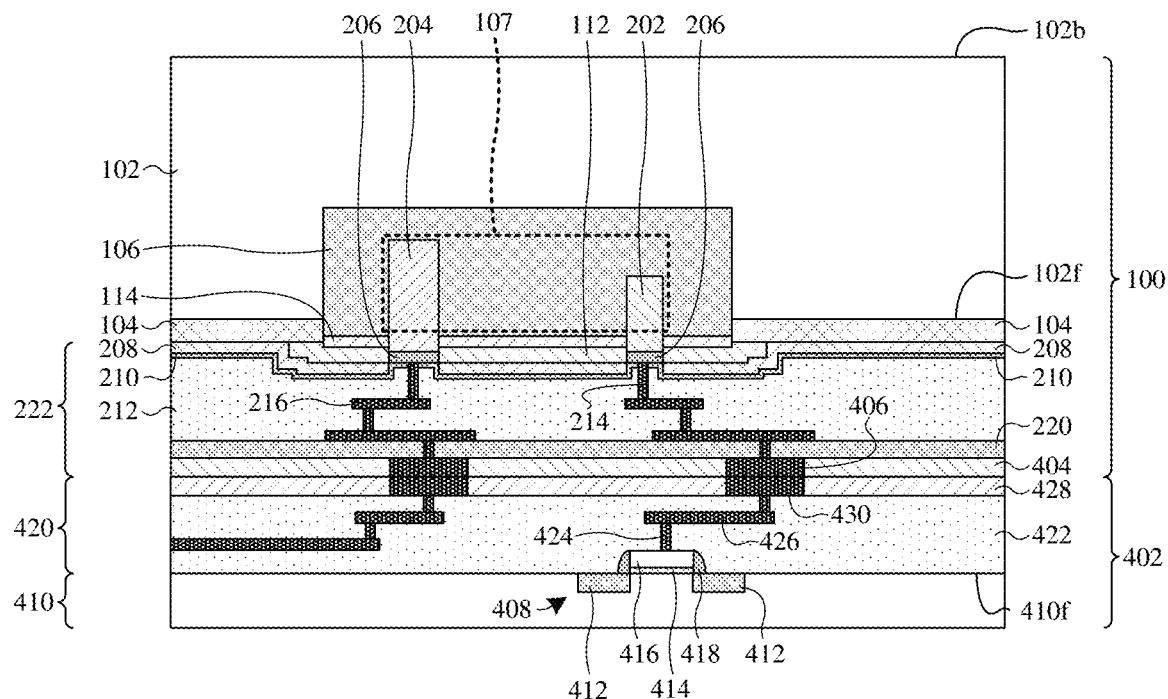

As shown in FIG. 18, the CMOS image sensor 100 is bonded to a logic device 402. In some embodiments, the CMOS image sensor 100 may be bonded to the logic device 402 by, for example, eutectic bonding, hybrid bonding, or the like. The logic device 402 comprises a semiconductor device 408 (e.g., a MOSFET) disposed on a front-side 410f of a second semiconductor substrate 410. In some embodiments, a process for forming the semiconductor device 408 comprises forming (e.g., by CVD and subsequent etching) a gate dielectric 414 and gate electrode 416 stacked on the front-side 410f of the second semiconductor substrate 410. A pair of source/drain regions 412 are formed (e.g., by selective ion implantation) in the semiconductor substrate 102 on opposite sides of the gate dielectric 414 and the gate electrode 416. Subsequently, sidewall spacers 418 are formed (e.g., by CVD and subsequent etching) on the front-side 410f of the second semiconductor substrate 410 on opposite sides of the gate electrode 416 and gate dielectric 414.

A second interconnect structure 420 is disposed on the front-side 410f of the second semiconductor substrate 410. In some embodiments, the second interconnect structure 420 comprises logic device conductive contacts 424 and logic device conductive features 426 disposed in a second ILD layer 422. In some embodiments, the second interconnect structure 420 may comprise a plurality of logic device contact pads 430 disposed in a second bonding structure 428. In further embodiments, a process for forming the second interconnect structure 420 may comprise a substantially similar process performed to form the interconnect structure 222. In yet further embodiments, the first bonding structure 404 and/or the CMOS image sensor contact pads 406 may be respectively bonded to the second bonding structure 428 and/or the logic device contact pads 430.

Figure 19:
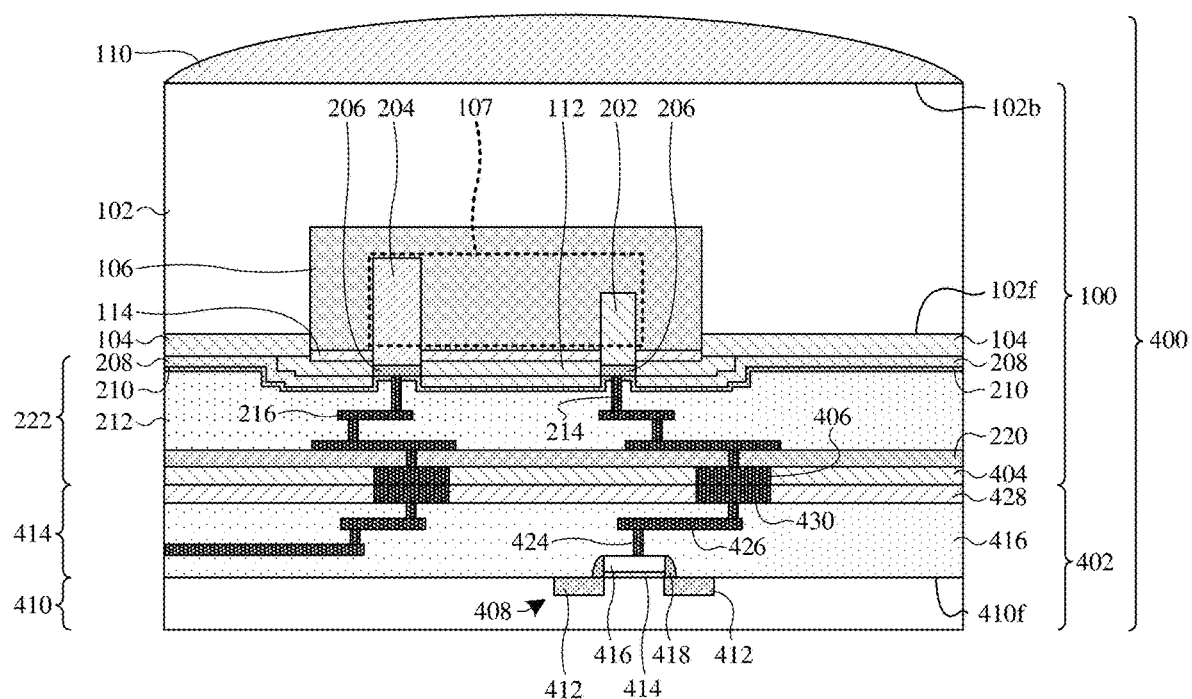

As shown in FIG. 19, a micro-lens 110 is formed on a back-side 102b of the semiconductor substrate 102. In some embodiments, the micro-lens 110 may be formed by depositing (e.g., by a spin-on method or a deposition process) a micro-lens material on the back-side 102b of the semiconductor substrate 102. In further embodiments, the bonded CMOS image sensor 100 and logic device 402 may be flipped (e.g., rotated 180 degrees) to form the micro-lens material on the back-side 102b of the semiconductor substrate 102. A micro-lens template (not shown) having a curved upper surface is patterned on the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lens 110 is then formed by selectively etching the micro-lens material according to the micro-lens template.

Figure 20:
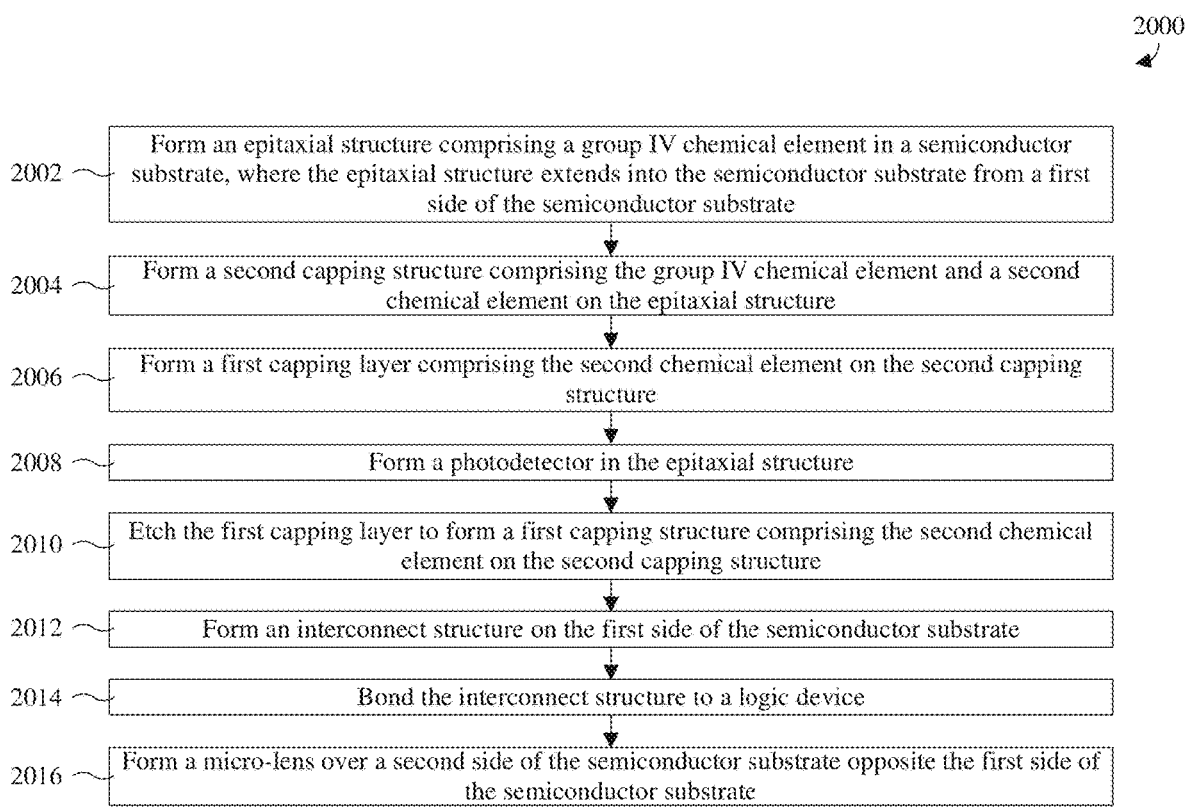
FIG. 20 illustrates a flowchart of some embodiments of the method of FIGS. 5-19.

As illustrated in FIG. 20, a flowchart 2000 of some embodiments of a method for forming a stacked CMOS image sensor comprising some embodiments of the CMOS image sensor of FIG. 1 coupled to a logic device is provided. While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 2002, an epitaxial structure comprising a group IV chemical element is formed in a semiconductor substrate, where the epitaxial structure extends into the semiconductor from a first side of the semiconductor substrate. FIGS. 5-6 illustrate a series of cross-sectional views of some embodiments corresponding to act 2002.

At 2004, a second capping structure comprising the group IV chemical element and a second chemical element is formed on the epitaxial structure. FIG. 7 illustrates a cross-sectional view of some embodiments corresponding to act 2004.

At 2006, a first capping layer comprising the second chemical element is formed on the second capping structure. FIG. 8 illustrates a cross-sectional view of some embodiments corresponding to act 2006.

At 2008, a photodetector is formed in the epitaxial structure. FIG. 9 illustrates a cross-sectional view of some embodiments corresponding to act 2008.

At 2010, the first capping layer is etched to form a first capping structure comprising the second chemical element on the second capping structure. FIG. 10 illustrates a cross-sectional view of some embodiments corresponding to act 2010.

At 2012, an interconnect structure is formed on the first side of the semiconductor substrate. FIGS. 11-17 illustrate a series of cross-sectional views of some embodiments corresponding to act 2012.

At 2014, the interconnect structure is bonded to a logic device. FIG. 18 illustrates a cross-sectional view of some embodiments corresponding to act 2014.

At 2016, a micro-lens is formed over a second side of the semiconductor substrate opposite the first side of the semiconductor substrate. FIG. 19 illustrates a cross-sectional view of some embodiments corresponding to act 2016.

In some embodiments, the present application provides a semiconductor device. The semiconductor device includes an epitaxial structure comprising a first group IV chemical element disposed in a semiconductor substrate, where the epitaxial structure extends into the semiconductor substrate from a first side of the semiconductor substrate. A photodetector is at least partially disposed in the epitaxial structure. A first capping layer having a first capping structure chemical element covers the epitaxial structure on the first side of the semiconductor substrate. A second capping structure is disposed between the first capping structure and the epitaxial structure, where the second capping structure comprises the first group IV chemical element and the first capping structure chemical element.

In other embodiments, the present application provides a semiconductor device. The semiconductor device includes an epitaxial structure comprising a group IV chemical element disposed in a semiconductor substrate, where the epitaxial structure extends into the semiconductor substrate from a front-side of the semiconductor substrate. A photodetector is at least partially disposed in the epitaxial structure. The photodetector comprises a first doped region and a second doped region at least partially disposed in the epitaxial structure and laterally spaced from one another, where the first doped region comprises a first doping type and the second doped region comprises a second doping type different than the first doping type. A first capping structure comprising a first capping structure chemical element covers the epitaxial structure on the front-side of the semiconductor substrate. A second capping structure is disposed between the first capping structure and the epitaxial structure, where the second capping structure comprises the first group IV chemical element and the first capping structure chemical element.

In yet other embodiments, the present application provides a method for forming a semiconductor device. The method includes forming a trench in a semiconductor substrate, where the trench extends into the semiconductor substrate from a front-side of the semiconductor substrate. An epitaxial structure is formed in the trench, where the epitaxial structure comprises a group IV chemical element. A first capping structure is formed on the epitaxial structure, where the first capping structure comprises the group IV chemical element and a first capping structure chemical element. A capping layer comprising the first capping structure chemical element is formed on the first capping structure, where sidewalls of the capping layer respectively offset from sidewalls of the first capping structure. A first doped region and a second doped region are formed at least partially in the epitaxial structure and spaced apart from one another, where the first doped region comprises a first doping type and the second doped region comprises a second doping type different than the first doped region. The capping layer is patterned into a second capping structure, where the second capping structure is separated from the epitaxial structure by the first capping structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
   an epitaxial structure comprising a first group IV chemical element material disposed in a semiconductor substrate, wherein the first group IV chemical element material is directly between sidewalls of the semiconductor substrate;
   a photodetector disposed in the epitaxial structure;
   a first capping structure disposed on a front-side of the semiconductor substrate and covering a lower surface of the epitaxial structure, wherein the first capping structure comprises a first capping structure chemical element different than the first group IV chemical element material;
   a second capping structure disposed between the first capping structure and the lower surface of the epitaxial structure, wherein the second capping structure comprises the first group IV chemical element material and the first capping structure chemical element; and
   wherein the first capping structure and the second capping structure have top surfaces that are below both bottoms of the sidewalls of the semiconductor substrate and the front-side of the semiconductor substrate.

2. The semiconductor device of claim 1, wherein the first capping structure extends laterally past an outermost edge of the lower surface of the epitaxial structure.

3. The semiconductor device of claim 1, wherein the first group IV chemical element material is germanium, the germanium continuously extending between the lower surface of the epitaxial structure and a top surface of the epitaxial structure that contacts the semiconductor substrate.

4. The semiconductor device of claim 1, wherein the first group IV chemical element material protrudes vertically outward past the front-side of the semiconductor substrate.

5. The semiconductor device of claim 1, further comprising:
   a dielectric layer disposed on the front-side of the semiconductor substrate, wherein a first portion of the dielectric layer is disposed vertically between the lower surface of the epitaxial structure and the front-side of the semiconductor substrate.

6. The semiconductor device of claim 5, wherein the dielectric layer contacts sidewalls of the epitaxial structure.

7. The semiconductor device of claim 5, wherein the first capping structure laterally overlaps a second portion of the dielectric layer.

8. A semiconductor device, comprising:
   an epitaxial structure comprising a first group IV chemical element material disposed in a semiconductor substrate;
   a first capping structure disposed on a front-side of the semiconductor substrate and covering the epitaxial structure, wherein the first capping structure comprises a first capping structure chemical element different than the first group IV chemical element material;
   a second capping structure disposed vertically between the first capping structure and the epitaxial structure, wherein the second capping structure comprises the first group IV chemical element material and the first capping structure chemical element;
   a photodetector disposed at least partially in the epitaxial structure, wherein the photodetector comprises a first doped region disposed partially in the epitaxial structure and extending vertically from the epitaxial structure through both the first capping structure and the second capping structure; and
   a first silicide structure disposed on the first doped region.

9. The semiconductor device of claim 8, wherein the first capping structure extends laterally past an outermost sidewall of the epitaxial structure that faces the semiconductor substrate.

10. The semiconductor device of claim 8, wherein the semiconductor substrate is silicon and the epitaxial structure is germanium, a sidewall of the germanium extending between top and bottom surfaces of the epitaxial structure and contacting the silicon.

11. The semiconductor device of claim 8, further comprising:
    an interlayer dielectric (ILD) layer disposed beneath the epitaxial structure, the first capping structure, the second capping structure, and the first silicide structure; and
    a conductive contact embedded in the ILD layer and electrically coupled to the first silicide structure.

12. The semiconductor device of claim 8, wherein the photodetector further comprises:
    a second doped region laterally spaced from the first doped region, wherein the second doped region is disposed partially in the epitaxial structure and extends vertically from the epitaxial structure through both the first capping structure and the second capping structure.

13. The semiconductor device of claim 12, further comprising:
    a second silicide structure disposed on the second doped region, wherein the second silicide structure is laterally spaced from the first silicide structure.

14. The semiconductor device of claim 13, further comprising:
    a dielectric layer disposed on the first capping structure, wherein the first capping structure vertically separates the dielectric layer from the epitaxial structure, and wherein a portion of the dielectric layer is disposed laterally between the first silicide structure and the second silicide structure.

15. The semiconductor device of claim 14, further comprising:
    a contact etch stop layer (CESL) disposed on the dielectric layer, wherein the dielectric layer vertically separates the CESL from the epitaxial structure.

16. A semiconductor device, comprising:

an epitaxial structure comprising a first group IV chemical element material disposed in a semiconductor substrate;

a first capping structure disposed on a first side of the semiconductor substrate and covering a lower surface of the epitaxial structure, wherein the first capping structure comprises a first capping structure chemical element different than the first group IV chemical element material;

a second capping structure disposed vertically between the first capping structure and the lower surface of the epitaxial structure, wherein the second capping structure comprises the first group IV chemical element material and the first capping structure chemical element; and a photodetector disposed at least partially in the epitaxial structure, wherein the photodetector comprises a first doped region having a first doping type and a second doped region having a second doping type opposite the first doping type, wherein the first doped region and the second doped region are at least partially disposed in the epitaxial structure, and wherein a portion of the epitaxial structure laterally separates the first doped region from the second doped region.

17. The semiconductor device of claim 16, wherein a portion of the first capping structure is disposed laterally between the first doped region and the second doped region.

18. The semiconductor device of claim 16, wherein a portion of the second capping structure is disposed laterally between the first doped region and the second doped region.

19. The semiconductor device of claim 16, wherein the portion of the epitaxial structure is undoped.

20. The semiconductor device of claim 16, wherein the first doped region is n-type and the second doped region is p-type.

* * * * *